(12) United States Patent
Kuzmenka et al.

(10) Patent No.: US 7,477,717 B2
(45) Date of Patent: Jan. 13, 2009

(54) INPUT RECEIVER CIRCUIT

(75) Inventors: Maksim Kuzmenka, Munich (DE);
Hermann Ruckerbauer, Moos (DE)

(73) Assignee: Infineon Technologies AG, Munich (DE)

( * ) Notice: Subject to any disclaimer, the term of this patent is extended or adjusted under 35 U.S.C. 154(b) by 706 days.

(21) Appl. No.: 10/831,001

(22) Filed: Apr. 23, 2004

(65) Prior Publication Data

US 2004/0260964 A1   Dec. 23, 2004

(30) Foreign Application Priority Data

Apr. 24, 2003 (DE) ................ 103 18 603

(51) Int. Cl.
*H03M 9/00* (2006.01)
(52) U.S. Cl. ...................... 375/377; 341/100
(58) Field of Classification Search ............... 375/377; 370/542, 360, 366; 713/500, 501, 502, 503; 341/100; 710/71; 327/403
See application file for complete search history.

(56) References Cited

U.S. PATENT DOCUMENTS

| | | | |
|---|---|---|---|
| 5,189,637 A | 2/1993 | Eriksson | |
| 5,400,026 A * | 3/1995 | Bradley | 341/133 |
| 5,939,895 A * | 8/1999 | Smith | 326/1 |
| 6,292,116 B1 * | 9/2001 | Wang et al. | 341/100 |
| 6,484,269 B1 * | 11/2002 | Kopylovitz | 714/5 |
| 2003/0043135 A1 * | 3/2003 | Chia | 345/204 |
| 2003/0174737 A1 * | 9/2003 | Tanabe | 370/536 |

FOREIGN PATENT DOCUMENTS

| | | |
|---|---|---|
| EP | 0 399 968 B1 | 11/1990 |
| JP | 58-161524 A | 9/1983 |
| JP | 2002-217695 A | 8/2002 |

OTHER PUBLICATIONS

Henrik O. Johansson, Jiren Yuan, Christer Svensson, "A 4 Gsamples/s Line Receiver in 0.8 μm CMOS" Dept of Physics and measurement Technology, Linköping University, Sweden, 1996 Symposium on VLSI Circuits Digest of Technical Papers, IEEE.*
Akira Tanabe, Yasushi Nakahara, Akio Furukawa Tohru Mogami, "A Redundant Multivalued Logic for a 10-Gb/s CMOS Demultiplexer IC", IEEE Journal of Solid-State Circuits, vol. 38, No. 1, Jan. 2003.*

* cited by examiner

*Primary Examiner*—Chieh M Fan
*Assistant Examiner*—Aristocratis Fotakis
(74) *Attorney, Agent, or Firm*—Slater & Matsil, L.L.P.

(57) ABSTRACT

An input receiver circuit is provided for receiving a noisy high-speed input signal and for generating a plurality of output signals that can be processed at a low acquisition speed compared to the speed of the high-speed input signal. The input receiver circuit includes an input for receiving the high-speed input signal (data), a plurality of integration elements and a switch for connecting the input to one of the plurality of integration elements for integrating the high-speed input signal. The input receiver circuit further includes a plurality of means for receiving one of the integrated high-speed input signals at a time and for outputting one of the plurality of output signals at a time, and a controller for controlling the switch.

4 Claims, 3 Drawing Sheets

INPUT RECEIVER CIRCUIT

BACKGROUND OF THE INVENTION

1. Field of the Invention

The present invention relates to an input receiver circuit for receiving a high-speed input signal representing one datum of a plurality of data in each of successive input clock intervals and for outputting a plurality of output signals which can be processed at a lower acquisition speed compared to the speed of the high-speed input signal, and each of which represents one datum of the plurality of data within an output clock interval.

2. Description of the Related Art

In numerous applications, in particular in data transmission, data storage and data processing, data serially coded by an input signal with a high-speed or transfer speed or data transfer rate have to be received and processed. In doing so, it is often desirable to acquire and process further the data with an acquisition speed lower than the transmission speed of the input signal.

For this purpose, a serial-to-parallel converter is conventionally used which receives data, which are serially coded in an input signal, and outputs them in parallel coded in a plurality of output signals.

FIG. 3 is a schematic circuit diagram of a conventional serial-to-parallel converter. The serial-to-parallel converter receives an input signal data at an input 10 and an input clock signal clock at a clock signal input 12. The serial-to-parallel converter outputs output signals representing data Q0, Q1, Q2, Q3 at the outputs 14, 16, 18, 20 in parallel fashion. Furthermore, the serial-to-parallel converter outputs an output clock signal clock/4 at a clock signal output 22.

The input clock signal is periodic and usually has a fixed clock frequency. Rising or falling edges of the input clock signal clock define successive input clock intervals or the limits thereof. The input signal data represents a sequence of data, the input signal data representing in each input clock interval a datum, for example a bit of a binary notation of a letter or of a number or of other information.

The output clock signal clock/4 is also periodic, its output clock frequency being a quarter of the input clock frequency of the input clock signal clock. Rising or falling edges of the output clock signal clock/4 define output clock intervals. The output signals Q0, Q1, Q2, Q3 represent data which the serial-to-parallel converter has received at the input 10 in the form of the input signal. In an output clock interval the output signals Q0, Q1, Q2, Q3 each represent a datum the serial-to-parallel converter has previously received by the input signal in four successive input clock intervals.

The serial-to-parallel converter includes four D-flip-flops 24, 26, 28, 30. Each of the D-flip-flops 24, 26, 28, 30 has an input D, a clock signal input C and an output Q. The clock signal inputs C of all D-flip-flops 24, 26, 28, 30 are connected to the clock signal input 12 of the serial-to-parallel converter to receive the input clock signal clock. The input D of the first D-flip-flop 24 is connected to the input 10 of the serial-to parallel converter. The output Q of the first D-flip-flop 24 is connected to the input D of the second D-flip-flop 26, the output Q of the second D-flip-flop 26 is connected to the input D of the third D-flip-flop, the output Q of the third D-flip-flop 28 is connected to the input D of the fourth D-flip-flop 30.

The serial-to-parallel converter further includes four memories 32, 34, 36, 38 which are also realized as D-flip-flops in this example. Each of the memories 32, 34, 36, 38 has an input D, a clock signal input C and an output Q. The input D of the first memory 32 is connected to the output Q of the first D-flip-flop 24, the input D of the second memory 34 is connected to the output Q of the second D-flip-flop 26, the input D of the third memory 36 is connected to the output Q of the third D-flip-flop 28 and the input D of the fourth memory 38 is connected to the output Q of the fourth D-flip-flop 30. The output Q of the fourth memory 38 is connected to the first output 14 of the serial-to-parallel converter, the output Q of the third memory 36 is connected to the second output 16 of the serial-to-parallel converter, the output Q of the second memory 34 is connected to the third output 18 of the serial-to-parallel converter and the output Q of the first memory 32 is connected to the fourth output 20 of the serial-to-parallel converter.

The serial-to-parallel converter further includes a frequency divider 40 having an input In and an output Out. The input In of the frequency divider 40 is connected to the clock signal input 12 of the serial-to-parallel converter in parallel to the clock signal inputs C of the D-flip-flops 24, 26, 28, 30, to receive the input clock signal clock. The output Out of the clock divider 40 is connected in parallel to the clock signal inputs C of the memories 32, 34, 36, 38 and to the clock signal output 22 of the serial-to-parallel converter. The clock divider 40 generates the output clock signal clock/4 whose output clock frequency is one quarter of the input clock frequency from the input clock signal clock.

The four D-flip-flops 24, 26, 28, 30 represent a shift register in which each datum of the input signal data is successively pushed through all D-flip-flops 24, 26, 28, 30. In each input clock interval, each D-flip-flop, 26, 28, 30 obtains the datum that was present in the previous D-flip-flop 24, 26, 28 in the previous input clock interval. Controlled by the output clock signal clock/4, after four input clock intervals the memories 32, 34, 36, 38 take over the data that are stored in the D-flip-flops 24, 26, 28, 30 at this time. As described above, at the end of respective four input clock intervals, output signals Q0, Q1, Q2, Q3 which the input signal data represented in the four input clock intervals serially are available in parallel at the outputs 14, 16, 18, 20 of the serial-to-parallel converter.

The sampling of a signal, for example of the input signal data of the serial-to-parallel converter illustrated in FIG. 3, needs a sampling time basically consisting of a setup time or initialization time or setting time and a hold time or holding time or a take over time. The setup time is the minimum period of time during which the signal to be sampled must be stable or unchanged before it is sampled. The hold time is the minimum period of time necessary for the sampling of the signal and during which the signal to be sampled must also be stable or unchanged. Both setup time and hold time depend, among other things, on the signal to be sampled, in particular on its signal level and its noise level, as well as on the sampling circuit.

In the conventional serial-to-parallel converter illustrated above using FIG. 3, setup time and hold time are limited by the length of an input clock interval, or, to be more accurate, by the period of time within an input clock interval within which the input signal data has a substantially constant signal level. The higher the data transmission rate of the input signal data or the input clock frequency of the input clock signal clock is, the shorter setup and hold time of the D-flip-flops 24, 26, 28, 30 have to be. However, the shorter setup and hold time of a circuitry are, the higher the development effort, production costs and power requirements thereof are as a rule. One disadvantage of the conventional serial-to-parallel converter illustrated by using FIG. 3 is thus that an increase of the transmission rate results in an increase of the costs of purchase and operation of the serial-to-parallel converter. This is even made worse by that all four D-flip-flops 24, 26, 28, 30 have to have the same short setup and hold times. The memories 32, 34, 36, 38 also have to accept the data from the D-flip-flops 24, 26, 28, 30 within a single input clock interval. Thus the setup and hold times of the memories 32, 34, 36, 38 cannot be longer than those of the D-flip-flops 24, 26, 28, 30 either.

In addition to that, the conventional serial-to-parallel converter illustrated by using FIG. 3 comprises a marked tendency towards bit errors, in particular when data and clock are transmitted over the same channel or when the input signal is noisy or has a high noise level. However, in many applications, namely in high-speed applications, the input signal has a high noise level.

The conventional serial-to-parallel converter illustrated in FIG. 3 is thus hardly suitable for receiving high-speed input signals or not at all. If at all, it is only adaptable to a high-speed application with a high effort in terms of circuit engineering and at the cost of high supply power requirements.

At the same time, the conventional serial-to-parallel converter has properties which are not of interest for many applications. These include, for example, the exact parallelity of the output signals. However, some of the development efforts, the production costs and the supply power requirements can be attributed to these properties.

SUMMARY OF THE INVENTION

It is the object of the present invention to provide an input receiver circuit and a method of receiving a noisy high-speed input signal and of generating a plurality of output signals which can be processed at a lower speed compared to the speed of the high-speed input signal.

In accordance with a first aspect, the present invention provides an input receiver circuit for receiving a noisy high-speed input signal and for generating a plurality of output signals which can be processed at a low acquisition speed compared to the speed of the high-speed input signal, having an input for receiving the high-speed input signal, a plurality of integration elements, a switch for connecting the input to one of the plurality of integration elements for integrating the high-speed input signal, a plurality of means for receiving one of the integrated high-speed input signals each and for outputting one of the plurality of output signals each and a controller for controlling the switch.

In accordance with a second aspect, the present invention provides a method of receiving a noisy high-speed signal and of generating a plurality of output signals which can be processed at a low acquisition speed compared to the speed of the high-speed input signal, having the steps of receiving the high-speed input signal, selecting a first of a plurality of integration elements, integrating the high-speed input signal with the first selected integration element, selecting a second of a plurality of integration elements after integrating the high-speed input signal with the first selected integration element, integrating the high-speed input signal with the second selected integration element, outputting a first output signal that depends on the high-speed input signal that has been integrated with the first integration element, and outputting a second output signal that depends on the high-speed input signal that has been integrated with the second integration element.

The present invention is based on the idea of integrating a serial high-speed input signal within an input clock interval and of sampling the integrated high-speed input signal during subsequent input clock intervals. For this purpose, a plurality of integration elements, for example capacitors, are provided, which integrate the high-speed input signal in one of several successive input clock intervals and hold the integrated high-speed input signal during successive input clock intervals. While the integrated high-speed input signal is hold by several input clock intervals within a period of time, it is sampled.

Depending on the number of integration elements, according to the present invention a considerable longer period of time during which the integrated high-speed input signal is sampled is thus available. The setup and hold time of the sampling means can thus be substantially longer than those of the D-flip-flops 24, 26, 28, 30 and of the memories 32, 34, 36, 38 of a conventional input receiver circuit, for example of a conventional serial-to-parallel converter. For this reason, the inventive input receiver circuit requires a low development and production effort and can be realized with low power requirements.

Another advantage of the present invention is that the inventive method of receiving a high-speed input signal has a lower susceptibility to bit errors and is thus also suitable in particular for a transmission of data and clock over the same channel.

A preferred application of the present invention is in data memories or memory devices for computer and other applications. The present invention is particularly applicable in a DRAM, SRAM, flash or also in another memory and in particular at the input side thereof, in order to receive a high-speed signal. The high-speed signal transmits, for example, data to be stored in the data memory, an address of a memory location in the data memory or a control signal for the data memory. The high-speed signal is received according to the present invention. In response to the high-speed signal, a plurality of output signals is output, which are processed by the data memory. This processing involves, for example, storing or reading out data, and both data to be stored and the address of a memory location in the data memory in which the data are to be stored or from which the data are to be read out and the control instructions for storing or reading out the data can be transmitted by the high-speed signal. The present invention enables also in this application a high transmission speed with a low development and production effort, and also offers low susceptibility to bit errors even in the case of a highly noisy or otherwise highly disturbed input signal.

According to a preferred embodiment of the present invention, the integration elements are capacitors charged by the input signal via a resistor. Alternatively, instead of the resistor a current source that can be controlled by the input signal is provided.

BRIEF DESCRIPTION OF THE DRAWINGS

These and other features of the present invention will become clear from the following description taken in conjunction with the accompanying drawings, in which.

DESCRIPTION OF THE PREFERRED EMBODIMENTS

Figure 1:
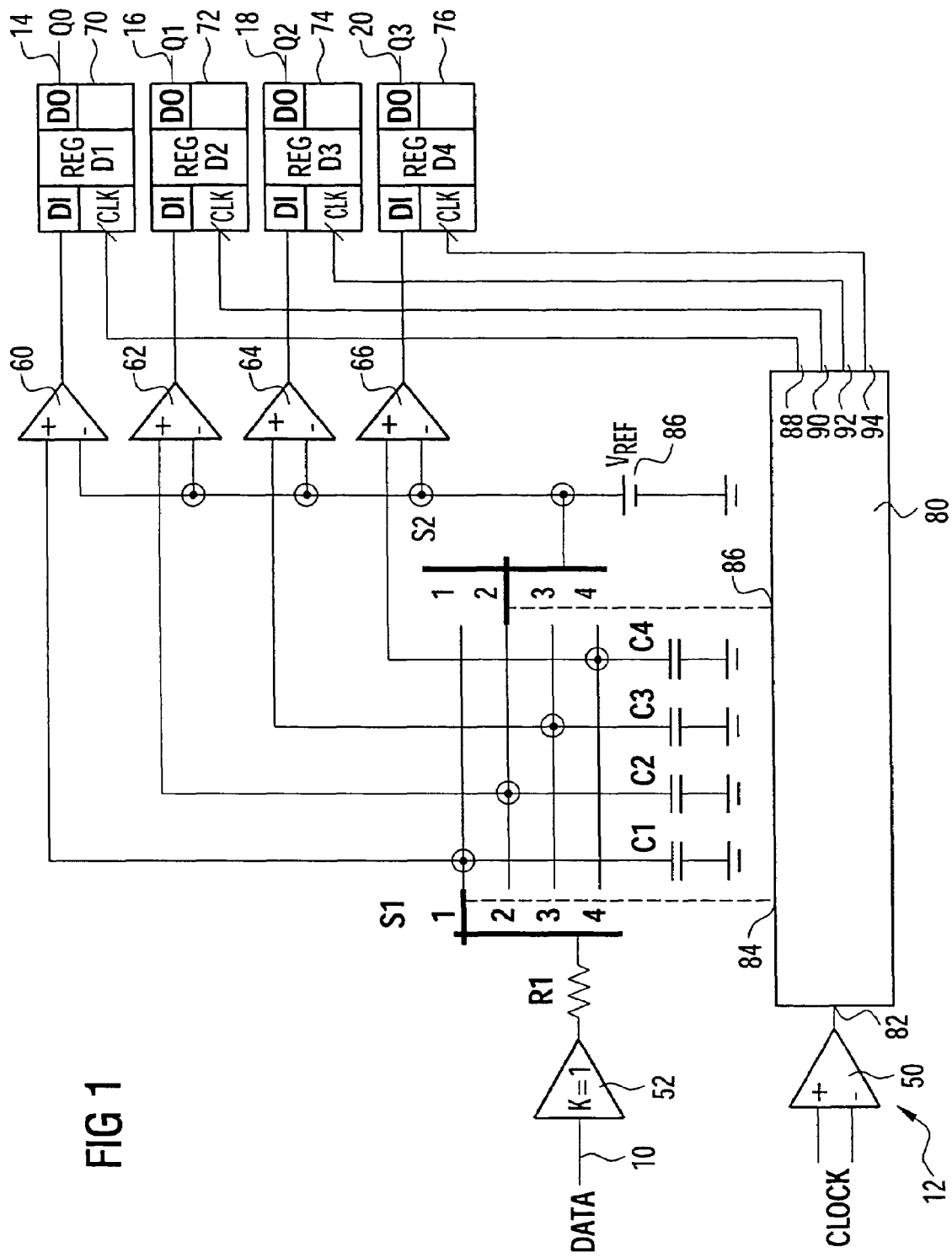
FIG. 1 is a schematic circuit diagram of an input receiver circuit according to a preferred embodiment of the present invention.

FIG. 1 is a schematic circuit diagram showing an input receiver circuit according to a preferred embodiment of the present invention. The inventive input receiver circuit includes an input 10 for receiving an input signal data and a clock signal input 12 for receiving an input clock signal clock. Preferably, the input signal is a high-speed input signal or an input signal having a high transmission rate. Further the inventive input receiver circuit includes outputs 14, 16, 18, 20 for outputting output signals Q0, Q1, Q2, Q3 in parallel. The clock signal input 12 is herein illustrated by way of example with an differential amplifier or comparator 50 whose two inputs +, − receive complementary signals or signals 1800 out of phase with respect to one another which together form the input clock signal clock.

The input 10 is connected to an amplifier having the gain K=1 or to a sequential circuit 52. The input signal buffered by the sequential circuit 52 is fed to a switch S1 via a resistor. Four capacitors C1, C2, C3, C4 are each connected to ground via one of their two electrodes. Switch S1 connects resistor R1 and thus input 10 selectably to one of the four capacitors C1, C2, C3, C4. A second switch S2 selectably connects one of the four capacitors C1, C2, C3, C4 to a pole of a reference voltage source 56 that generates a reference voltage Vref with respect to ground.

The switches S1, S2 are preferably quadruple changeover switches and are also illustrated as such in FIG. 1. At each time, each of them connects exactly one of the capacitors C1, C2, C3, C4 at most with the input 10 or the reference voltage source 56. Each of the switches S, S2 is preferably composed of four single switches which are embodied as field effect transistors, for example.

Each of four comparators or differential amplifiers 60, 62, 64, 66 has a first input + and a second input −. The first input + of the first comparator 60 is connected to the first capacitor C1, the first input + of the second comparator 62 is connected to the second capacitor C2, the first input + of the third comparator 64 is connected to the third capacitor C3, and the first input + of the fourth comparator 66 is connected to the fourth capacitor C4. The second inputs − of all four capacitors 60, 62, 64, 66 are connected to the reference voltage source 56 as is the switch S2.

Each of four memories or latches 70, 72, 74, 76 (REG D1, REG D2, REG D3, REG D4) has a data input DI, a data output DO and a control signal input or a data take over control input CLK. The data input DI of the first memory 70 is connected to the output of the first comparator 60, the data input DI of the second memory 72 is connected to the output of the second comparator 62, the data input DI of the third memory 74 is connected to the output of the third comparator 64, and the data input DI of the fourth memory 76 is connected to the output of the fourth comparator 66. The data output DO of the first memory 70 is connected to the first output 14 of the input receiver circuit, the data output DO of the second memory 72 is connected to the second output 16 of the input receiver circuit, the data output DO of the third memory 74 is connected to the third output 18 of the input receiver circuit, and the data output DO of the fourth memory 76 is connected to the fourth output 20 of the input receiver circuit.

A control logic or logic circuit or controller 80 has a control signal input 82, a first switch control output 84 and a second switch control output 86. If the switches S1, S2, as illustrated above as a preferred embodiment, are each formed of four single switches, each of the switch control outputs 84, 86 preferably consists of four single signal outputs connected to the single switches of the switches S1, S2. Via each of the single signal outputs of the first switch control output 84, a signal S1C1, S1C2, S1C3, and S1C4, respectively, is transmitted to one of the single switches of the first switch S1, which controls or opens and closes it. Likewise, via each of the single signal outputs of the second switch control output 86 a signal S2C1, S2C2, S2C3, and S2C4, respectively, is transmitted to a respective one of the single switches of the second switch S2 which controls or opens and closes it.

The controller 80 further comprises four control signal outputs 88, 90, 92, 94. Each of the four control signal outputs 88, 90, 92, 94 is connected to a control signal input CLK of one of the four memories 70, 72, 74, 76 via a control line.

Figure 2:
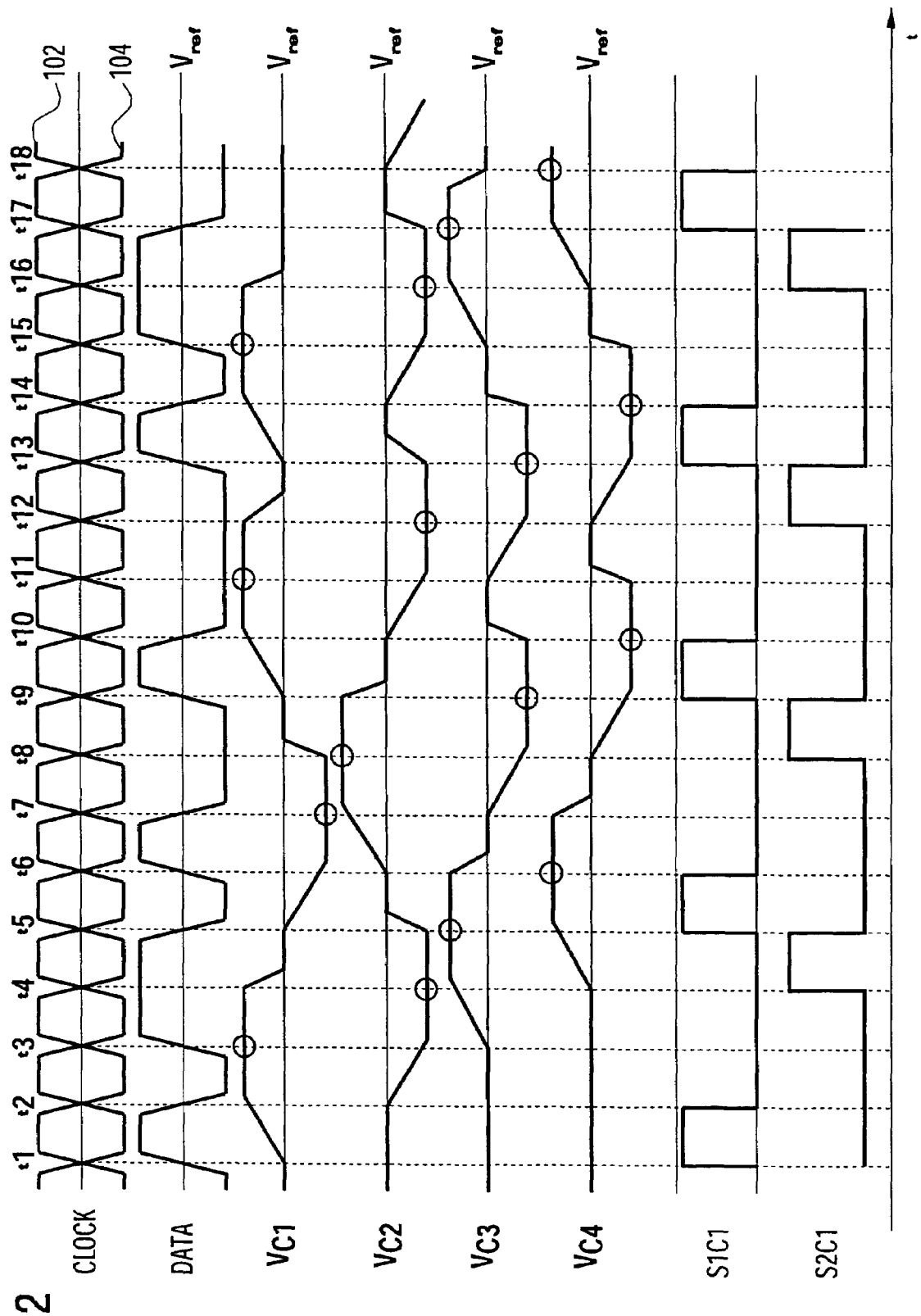
FIG. 2 is a schematic illustration of the time dependencies of signals in the input receiver circuit illustrated in FIG. 1.

The function of the inventive input receiver circuit illustrated in FIG. 1 is hereinafter explained with reference to FIG. 2. FIG. 2 is a schematic diagram showing time dependence of signals, voltages and switch positions of the input receiver circuit shown in FIG. 1. Time t is associated with the abscissa, the signal levels or voltages are associated with the ordinate.

At the very top of FIG. 2, the input clock signal clock is illustrated which consists of two complementary signals 102, 104 as mentioned. Underneath, the input signal data is illustrated. Underneath, the voltages $V_{C1}, V_{C2}, V_{C3}, V_{C4}$, which are applied at the capacitors C1, C2, C3, C4, are illustrated. With regard to the input signal data and each of the voltages $V_{C1}, V_{C2}, V_{C3}, V_{C4}$, a thin horizontal straight line illustrates the reference voltage $V_{ref}$.

Finally, the signals S1C1 and S2C1 are illustrated below the voltages $V^{C1}, V_{C2}, V_{C3}, V_{C4}$, which are present at the capacitors C1, C2, C3, C4. These signals S1C1 and S1C2 relate to the above-illustrated preferred embodiment of the switches S1, S2 having four single switches each. The first single switch of the first switch S1 connecting the first capacitor C1 with the input 10 is controlled by the signal S1C. The first single switch of the second switch S2 connecting the first capacitor C1 to the reference voltage source 56 is controlled by the signal S2C1. Each of a high signal level or a logic unity in the signals S1C1 and S2C1 controls a closing of the first single switch of the first switch S1 or of the first single switch of the second switch S2. Each of a low signal level or a logic zero each controls an opening of the first single switch of the first switch S1 or of the first single switch of the second switch S2.

The time dependencies of the signal levels or voltages are depicted in a highly simplified manner. In particular, only ramps having a constant slope or flanks having a constant rate of change (voltage/time) as well as plateaus having a constant voltage are shown. At variance with this, real wave forms have edges with varying rate of change, round transitions between edges and plateaus, a superimposed noise and other disturbances.

In a first input clock interval between a time $t_1$ and a time $t_2$ the input signal data having a high level represents a logic 1. (Alternatively, a high level represents a logic 0 and a low level represents a logic 1. However, this does not change anything in the function of the inventive serial-to-parallel converter.) In this first input clock interval, the signal S1C1 has a high level. As a result of the high signal level of the signal S1C1, the first single switch of the first switch S1 connects the first capacitor C1 (via resistor R1 and sequential circuit 52) to the input 10. As a result of this, the first capacitor C1 is charged, and in so doing its voltage $V_{C1}$ increases.

In the subsequent input clock intervals between times $t_1$ and $t_3$ and between times $t_3$ and $t_4$, both the signal S1C1 and the signal S2C1 have a low signal level. For this reason, each of the first single switches of the first switch S1 and of the second switch S2 is open. Expressed in another way and independently from the embodiment of the switch S2, none of the two switches S1, S2 is in position 1 (FIG. 1). For this reason, the charge on the capacitor C1 and thus the voltage $V_{C1}$ thereof remain constant, apart from a not-illustrated slight discharge via the finite internal resistance of the first comparator 60.

Approximately at a time $t_3$, the controller 80 generates a control signal for the first memory 70 at its first control output 88. Due to the control signal from the controller 80, the first memory 70 samples the output of the first comparator 60. The comparator signal or output signal, respectively, of the first comparator 60 indicates that the voltage $V_{C1}$ at the first capacitor C1 is greater than the reference voltage $V_{ref}$. This information or the comparator signal of the first comparator 60, respectively, is taken into the first memory 70 and output to its output DO.

The first comparator 60 and the first memory 70 together form a means for receiving the input signal data integrated by the first capacitor C1 and for outputting an output signal indicating whether the voltage $V_{C1}$ at the first capacitor C1 is greater or smaller than the reference voltage $V_{ref}$. Thus the output signal Q0 at the first output 14 of the inventive input receiver circuit indicates whether the input signal data had a high or a low level within the first input clock interval between times T1 and T2. The first output signal Q0 at the first output 14 of the input receiver circuit thus represents the datum which the input signal data represented between times $t_1$ and $t_2$. In a fourth input clock interval between times $t_4$ and $t_5$, the signal S2C1 has a high signal level. Controlled by this high signal level, the first single switch of the second switch S2 closes and connects the first capacitor C1 to the reference voltage source 56. Expressed in another way and independently from the embodiment of the switch S2, the second switch S2 is in the position 1 (FIG. 1), i.e. it connects the capacitor C1 to the reference voltage source 56. The first capacitor C1 is thus discharged, and its voltage adapts to the reference voltage $V_{ref}$.

In the subsequent input clock interval between times $t_5$ and $t_6$, again controlled by the high signal level of the signal S1C1, the first switch S1 connects the first capacitor C1 to the input 10. In this input clock interval the input signal data has a low level which is below the reference voltage $V_{ref}$. For this reason, the first capacitor C1 continues to be discharged, and its voltage $V_{C1}$ sinks below the reference voltage $V_{ref}$.

In the following input clock intervals between times $t_6$ and $t_8$, the first capacitor C1 is again isolated or connected neither to the input 10 nor to the reference voltage source 56. At time $t_7$ the controller 80 generates a control signal for the first memory 70 at its first control output 88. Controlled by this control signal, the first memory 70 samples the current comparator signal of the first comparator 60. This corresponds to a sampling of the input signal data integrated on the first capacitor C1 by the first comparator 60 and the first memory 70. Since the integrated input signal or the voltage $V_{C1}$, respectively, is smaller than the reference voltage $V_{ref}$, the first memory 70 now stores a logic 0. For this reason, a first output signal Q0 indicating that the input signal data had a low level or represented a logic 0, respectively, in the fifth input clock interval between times $t_5$ and $t_6$ is then present at the output DO of the first memory 70 and at the output 14 of the input receiver circuit.

The procedure described at the first capacitor C1, the first comparator 60 and the first memory 70 now repeats with a period of four input clock intervals. In the first input clock interval of each period the first capacitor C1 is charged by the input signal data. Afterwards, its voltage $V_{C1}$ is greater or smaller than the reference voltage $V_{ref}$ depending on whether the input signal data had a high or low level in this input clock interval. The second and the third input clock interval of each period are available so that the first comparator 60 and the first memory 70 sample the input signal data integrated at the first capacitor C1 together and output an output signal at the first output 14 of the input receiver circuit, which reflects or represents the input signal data or its level, respectively, or the datum represented by this level. In the fourth input clock interval of each period the first capacitor C1 is discharged or moved into a defined charge state by connecting it to the reference voltage source 56 through the second switch S2.

The same process also repeats for the second capacitor C2, the third capacitor C3 and the fourth capacitor C4, although shifted by one input clock interval with respect to one another. That means that in the first input clock interval between times $t_1$ and $t_2$ the first capacitor C1 is charged by the input signal data, in the second input clock interval between times $t_2$ and $t_3$ the second capacitor C2 is charged by the input signal data, in the third input clock interval between times $t_3$ and $t_4$ the third capacitor C3 is charged by the input signal data, and in the fourth input clock interval between times $t_4$ and $t_5$ the fourth capacitor C4 is charged by the input signal data.

The signals S1C2, S1C3, S1C4, S2C2, S2C3, S2C4, which control the charging of the capacitors C2, C3, C4 via the switch S1 or its single switches and the discharging of the capacitors C2, C3, C4 via the switch S2 or its single switches are not illustrated in FIG. 2. The signals S1C2 and S2C2 are shifted with respect to the signals S1C1 or S2C1, respectively, by the duration of one input clock interval etc.

The process in the first four input clock intervals between times $t_1$ and $t_5$, respectively, repeats in the next, second next, . . . four input clock intervals between times $t_5$ and $t_9$ or, respectively, between times $t_9$ and $t_{13}$ . . .

Four subsequent input clock intervals form an output clock interval. Within an output clock interval, each of the four capacitors C1, C2, C3, C4 is charged (or discharged) once by the input signal data, as described above, and the value stored in each of the four memories 70, 72, 74, 76, or the stored datum, respectively, is redetermined once. The time at which the input signal data integrated on the capacitors C1, C2, C3, C4 is sampled as well as the value of the integrated input signal being present at this time is made illustrated by a circle 106 in FIG. 2.

Figure 3:
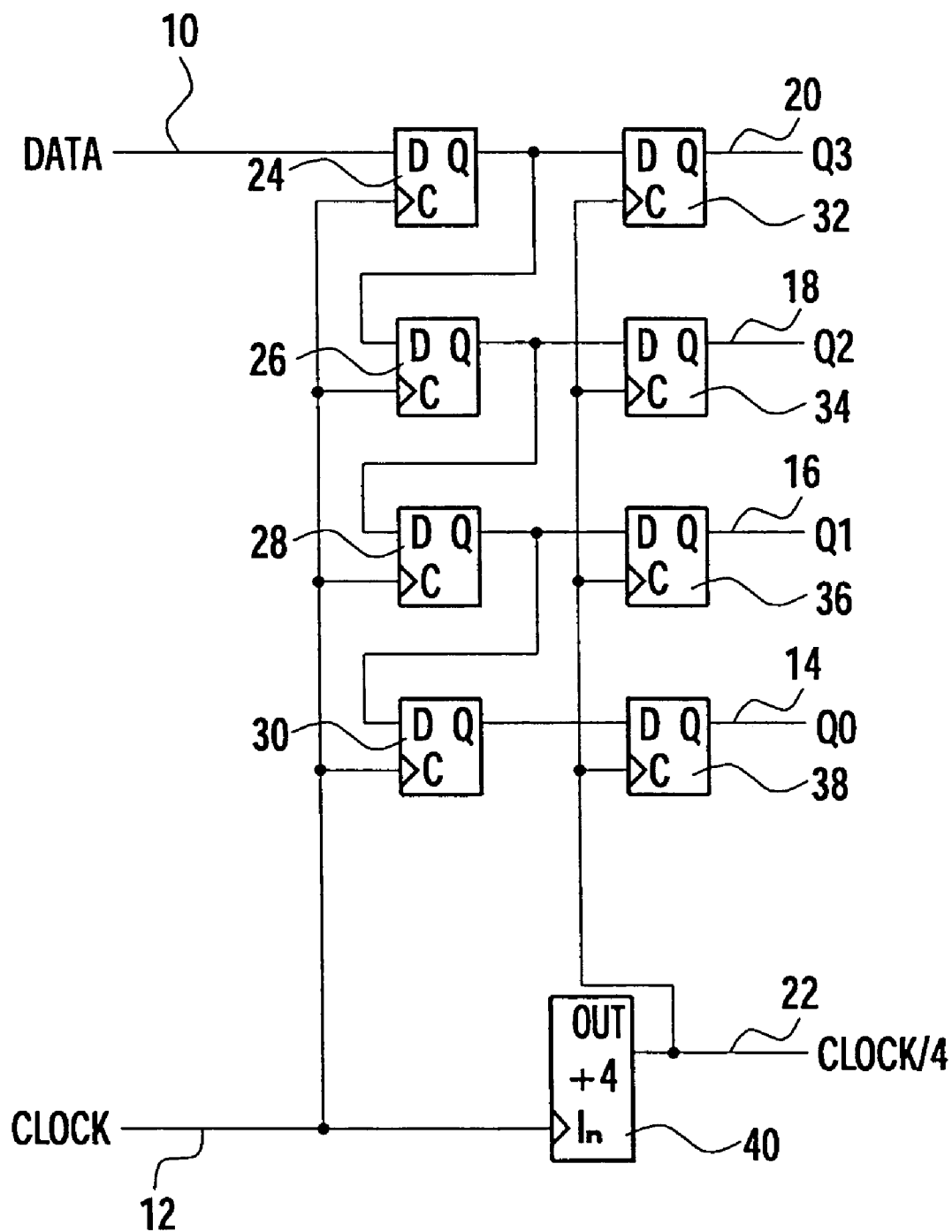
FIG. 3 is a schematic circuit diagram of a conventional serial-to-parallel converter.

In FIG. 1 it can be seen that only the switches S1, S2, the resistor R1 and the capacitors C1, C2, C3, C4 directly come into contact with the input signal data. The resistor R1 and the capacitors C1, C2, C3, C4 are passive devices to which in principle arbitrarily high data transmission rates can be applied at input 10 of the input receiver circuit. The switches S1, S2 are devices which can readily be designed for very high switching speeds and can thus be adapted to very high data transmission rates. As can be seen clearly in FIG. 2, two input clock intervals and thus twice as much time as to the D-flip-flops 24, 26, 28, 30 and to the memories 32, 34, 36, 38 of the conventional serial-to-parallel converter described at the beginning by using Fig. are available to the comparators 60, 62, 64, 66 and to the memories 70, 72, 74, 76. For this reason, setup and hold time for this sampling can be selected to be twice that long. Alternatively, with unchanged setup and hold times a data transmission rate is selected twice as high as compared to the conventional serial-to-parallel converter illustrated above by using FIG. 3.

The factor by which the period of time available for the sampling is longer than an input clock interval depends on the number of capacitors C1, C2, C3, C4. According to the present invention, with a high number of capacitors, comparators and memories a further increase in the data transmission rate is thus possible with unchanged setup and hold times. Conversely, with unchanged data transmission rate setup and hold times of the components of the inventive input receiver circuit can be increased further to decrease development and production effort and power requirements of the input receiver circuit.

The present invention may also be embodied involving less than four capacitors. When using three capacitors, three comparators and three memories the requirements with regard to setup and holt time compared to the conventional serial-to-parallel converter are unchanged, however, the inventive input receiver circuit still has the advantage of being less susceptible to bit errors. The present invention is realizable with two capacitors, two comparators and two memories, if the resetting of the charge of a capacitor caused by the second switch S2 does not require its own input clock interval, as has been described above by using FIG. 2, but takes place within a very short time between two input clock intervals.

The inventive input receiver circuit as illustrated in FIG. 1 is preferably supplemented by features as known from conventional serial-to-parallel converters, for example by an output for outputting the output clock signal, means permitting a cascading of multiple input receiver circuits etc.

The times illustrated in FIG. 2 by the circles 106 at which the controller 80 controls a sampling of a comparator output by the associated memory via one of its control outputs 88, 90, 92, 94 can in contrast to the illustration in FIG. 2 be arranged asymmetrically, so that it does not coincide with a boundary between two successive input clock intervals and the setup and the hold time have unequal lengths.

The inventive input receiver circuit illustrated by using the FIGS. 1 and 2 is further designed for a binary input signal data. However, it can be seen that by using multiple comparators at one capacitor and corresponding memories ternary signals or signals having an even higher number of different possible signal levels can also be received.

Furthermore, for example coils or other devices may also be used as integration elements instead of the illustrated capacitors. In the case of coils, a coil current has to be sampled instead of a capacitor voltage.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An input receiver circuit for receiving a noisy high-speed input signal and for generating a plurality of output signals that can be processed at a low acquisition speed compared to the speed of the high-speed input signal, comprising:
    an input for receiving the high-speed input signal;
    a plurality of integration elements;
    a switch for connecting the input to one of the plurality of integration elements for integrating the high-speed input signal;
    a controller for controlling the switch; and
    a plurality of receivers for receiving one of the integrated high-speed input signals at a time and for outputting one of the plurality of output signals at a time, wherein
    each of the plurality of receivers further coupled to a latch each having a data input and a data take over control input,
    each of the output signals can be fed to a data input of one of the latches,
    the data take over control inputs of the latches are connected to the controller,
    the controller comprises a clock signal input for receiving a clock signal in a temporal relationship with the high-speed input signal, the controller being further formed such that it generates data take over control signals having fixed phase relationships with regard to the clock signal to control a data take over by the latches and that it controls the switch with fixed phase relationships with regard to the clock signal.

2. The input receiver circuit according to claim 1, wherein each of the plurality of integration elements includes a capacitor.

3. The input receiver circuit according to claim 1, further comprising a resistor connected between the input and the switch.

4. The input receiver circuit according to claim 1, wherein the high-speed input signal is a current signal, further comprising a constant-current source having a control input for receiving a voltage input signal and a current output for generating the current signal controlled by the voltage input signal.

* * * * *